(12) United States Patent
Liu

(10) Patent No.: US 11,422,416 B2
(45) Date of Patent: Aug. 23, 2022

(54) ARRAY SUBSTRATE AND DISPLAY PANEL

(71) Applicant: HKC Corporation Limited, Shenzhen (CN)

(72) Inventor: Zhongnian Liu, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 17/044,019

(22) PCT Filed: Nov. 13, 2018

(86) PCT No.: PCT/CN2018/115179
§ 371 (c)(1),
(2) Date: Sep. 30, 2020

(87) PCT Pub. No.: WO2020/087567
PCT Pub. Date: May 7, 2020

(65) Prior Publication Data
US 2021/0124224 A1  Apr. 29, 2021

(30) Foreign Application Priority Data
Oct. 29, 2018 (CN) .......................... 201811269419.1

(51) Int. Cl.
| G02F 1/1343 | (2006.01) |
| G02F 1/1362 | (2006.01) |
| G02F 1/1368 | (2006.01) |
| H01L 27/12 | (2006.01) |

(52) U.S. Cl.
CPC ...... *G02F 1/136204* (2013.01); *G02F 1/1368* (2013.01); *G02F 1/136213* (2013.01); *H01L 27/1255* (2013.01); *G02F 2201/123* (2013.01)

(58) Field of Classification Search
None
See application file for complete search history.

(56) References Cited

U.S. PATENT DOCUMENTS

| 8,045,104 B2* | 10/2011 | Cho .................. G02F 1/133512 349/110 |
| 2002/0033922 A1* | 3/2002 | Hidehira ........... G02F 1/134363 349/141 |
| 2012/0154703 A1* | 6/2012 | Yoshida ............ G02F 1/133528 349/43 |

(Continued)

FOREIGN PATENT DOCUMENTS

| CN | 103901663 A | 7/2014 |
| CN | 104199224 A | 12/2014 |

(Continued)

OTHER PUBLICATIONS

English Translation of the International Search Report dated Aug. 2, 2019, issued in corresponding International Application No. PCT/CN2018/115179, filed Nov. 13, 2018, 2 pages.

(Continued)

*Primary Examiner* — Thanh Nhan P Nguyen

(57) ABSTRACT

An array substrate includes a pixel electrode and a first common electrode. The pixel electrode has a frame and a branch. An edge plate of the first common electrode includes a shielding polar plate that surrounds the orthographic projection of the frame. The side of the edge plate facing the branch is provided with a groove.

19 Claims, 3 Drawing Sheets

(56) References Cited

U.S. PATENT DOCUMENTS

2012/0249941 A1* 10/2012 Yamamoto ............ G02F 1/1368
349/123
2016/0062200 A1    3/2016 Jung et al.
2016/0252793 A1*  9/2016 Cheng ............... H01L 29/78633
257/72

FOREIGN PATENT DOCUMENTS

| CN | 106094368 A | 11/2016 |
| CN | 107367873 A | 11/2017 |
| CN | 208848020 U | 5/2019 |

OTHER PUBLICATIONS

Chinese Office Action dated Jun. 17, 2019, issued in corresponding CN Application No. 201811269419.1, filed Oct. 29, 2018, 8 pages.

* cited by examiner

ARRAY SUBSTRATE AND DISPLAY PANEL

TECHNICAL FIELD

This application relates to the field of display technologies, and in particular, to an array substrate and a display panel.

BACKGROUND

The statements herein merely provide background information related to the present application and do not necessarily constitute the prior art.

With the development of the display technology, various liquid crystal display devices (such as LCD television) are widely used. The display panel generally includes an array substrate and a color film substrate disposed opposite to each other. Liquid crystal molecules are filled between the array substrate and the color film substrate.

A pixel electrode located inside the sub-pixel and a first common electrode located at an edge of the sub-pixel are provided in the array substrate. A second common electrode having the same potential as the first common electrode is provided on the color film substrate. The pixel electrode is arranged to supply power to the sub-pixel for light emitting. The first common electrode includes a shielding electrode plate, and there is no voltage difference between the shielding electrode plate and the second common electrode, so that the liquid crystal molecules between them are all standing to cover the light source, thereby causing the edge of the sub-pixel to be displayed in a dark state.

When the display panel is operating, the electric field on the pixel electrode may be easily affected by the electric field on the first common electrode (shielding electrode plate), and dark lines may be formed at the edge of the sub-pixel, thereby affecting the transmittance of the panel.

SUMMARY

According to various embodiments of the present application, an array substrate and display panel capable of improving on the dark lines phenomenon at the edge of each sub-pixel is provided.

An array substrate includes:

a pixel electrode, including a frame and a branch connected to the frame, the frame surrounding the branch; and a first common electrode insulated from the pixel electrode, including a side plate disposed opposite to the frame, the side plate including a shielding electrode plate, wherein the shielding electrode plate surrounds an orthographic projection of the frame, and a groove is provided on a side of the side plate facing the branch.

In one of the embodiments, the groove is opposite to an orthographic projection of the branch.

In one of the embodiments, one groove is opposite to the orthographic projection of one branch.

In one of the embodiments, one groove is opposite to orthographic projections of a plurality of branches.

In one of the embodiments, a plurality of the grooves is opposite to the orthographic projection of one branch.

In one of the embodiments, the side plate further includes a capacitor electrode plate, the capacitor electrode plate and the shielding electrode plate being connected to each other, and the capacitor electrode plate forming a storage capacitor with the frame.

In one of the embodiments, the groove is formed on the capacitor electrode plate.

In one embodiment, the groove is disposed through the capacitor electrode plate and the shielding electrode plate.

In one of the embodiments, one groove is disposed opposite to an orthographic projection of one branch.

In one of the embodiments, an area of a notch of the groove is larger than an area of a surface of the branch facing a side of the groove.

In one of the embodiments, a cross-sectional shape of a cross section of the groove in a direction perpendicular to a thickness of the side plate is a polygon.

In one of the embodiments, the polygon is a quadrangle.

In one embodiment, the quadrangle is a rectangle, a square, a parallelogram, a diamond or a trapezoid.

In one of the embodiments, the polygon is a triangle, a pentagon or a hexagon.

In one embodiment, the pixel electrode further includes a trunk connected at both sides to the branch, and the trunk divides an internal region of the pixel electrode into a plurality of domains; the length directions of the branches in adjacent domains are different, and the grooves are disposed on the side plates corresponding to the domains.

In one embodiment, the trunk includes a first trunk and a second trunk; the first trunk intersects the second trunk and divides the inner region of the pixel electrode into four domains of equal size.

In one of the embodiments, the array substrate further includes a central plate, and the first trunk forms a storage capacitor with the central plate.

In one of the embodiments, the central plate connects opposite sides of the side plate.

An array substrate includes:

a pixel electrode, including a frame, a trunk and a branch; the frame connects and surrounds the trunk and the branch; the trunk includes a first trunk and a second trunk, the first trunk intersecting the second trunk and dividing the inner region of the pixel electrode into four domains of equal size; the branch is distributed in each of the domains and connects the trunk and the frame, and the length directions of the branches in adjacent domains are different; and a first common electrode insulated from the pixel electrode, including a side plate disposed opposite to the frame; the side plate includes a shielding electrode plate and a capacitor electrode plate; the shielding electrode plate surrounds an orthographic projection of the frame, the capacitor electrode plate forms a storage capacitor with the frame, and a groove opposite to orthographic projection of the branch is provided on a side of the side plate facing the branch.

A display panel includes liquid crystal molecules, a color film substrate and an array substrate, wherein the array substrate is disposed opposite to the color film substrate, and the liquid crystal molecules are located between the color film substrate and the array substrate, the array substrate including:

a pixel electrode, including a frame and a branch connected the frame, the frame surrounding the branch; and a first common electrode insulated from the pixel electrode, including a side plate disposed opposite to the frame, the side plate including a shielding electrode plate, wherein the shielding electrode plate surrounds an orthographic projection of the frame, and a groove is provided on a side of the side plate facing the branch;

the color film substrate includes a second common electrode, and the second common electrode and the first common electrode have an equal potential.

In the above array substrate, the side plate of the first common electrode includes a shielding electrode plate, and a groove is provided on a side of the side plate facing the branch. The distance between the shielding electrode plate corresponding to the groove and a side of the frame connected to the branch is increased. Therefore, the influence of the electric field of the shielding electrode plate to the electric field of the branch through which the liquid crystal molecules transmit light is weaken, thereby improving on the dark line phenomenon at the edge of the sub-pixel.

The details of one or more embodiments of the disclosed subject matter are set forth in the accompanying drawings and the description below. Other features, objects, and advantages of the disclosed subject matter will be apparent from the description and drawings, and from the claims.

DESCRIPTION OF THE DRAWINGS

To better describe and illustrate embodiments or examples of the subject matter disclosed herein, reference may be made to one or more drawings. Additional details or examples used to describe the figures are not to be construed as limiting the scope of any of the disclosed subject matter.

DETAILED DESCRIPTION

In order to make the objects, technical solutions and advantages of the present application more clear, the present application will be further described in detail below with reference to the accompanying drawings and embodiments. It is understood that the specific embodiments described herein are merely illustrative of the application and are not intended to be limiting.

The array substrate and the display panel provided in the present application may be applied to a liquid crystal display device such as liquid crystal television etc.

Figure 1:
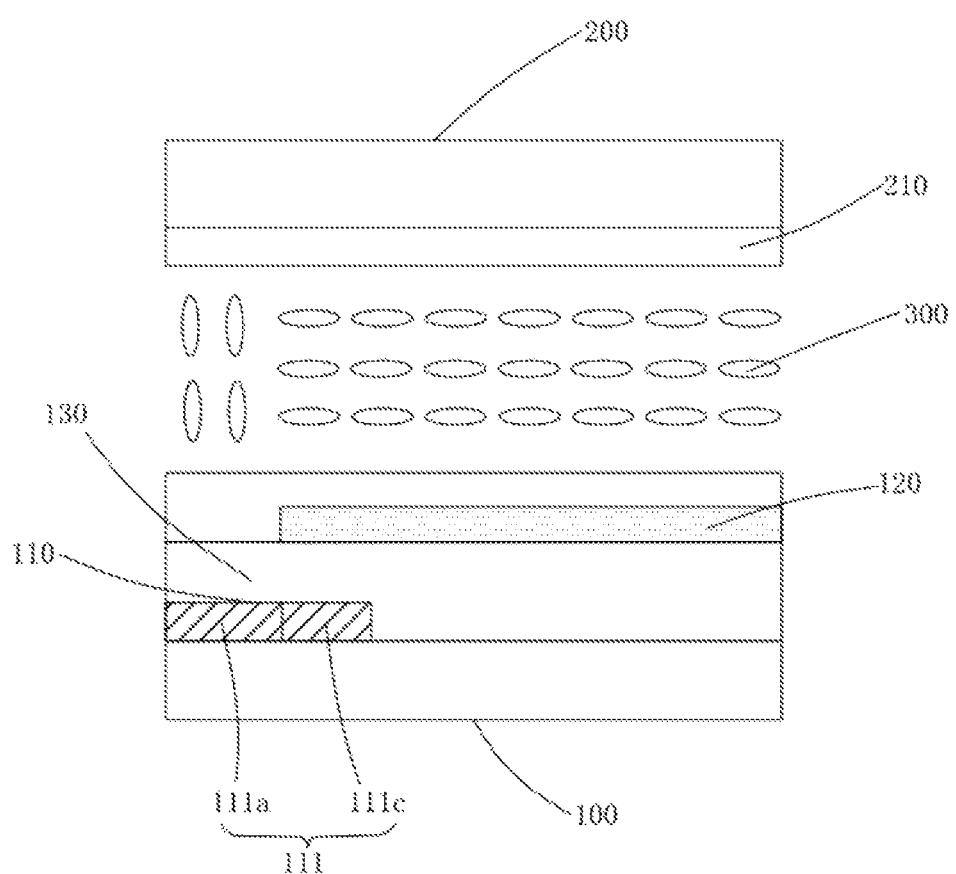
FIG. 1 is a schematic view of a display panel in one embodiment.

In one embodiment, as shown in FIG. 1, a display panel is provided. The display panel includes an array substrate 100, a color film substrate 200, and liquid crystal molecules 300. The array substrate 100 is disposed opposite to the color film substrate 200. The liquid crystal molecules 300 are located between the array substrate 100 and the color film substrate 200. The array substrate 100 includes a first common electrode 110, a pixel electrode 120, an insulating layer 130, and the like. The first common electrode 110 and the pixel electrode 120 are insulated from each other by the insulating layer 130 therebetween. The color film substrate 200 includes a second common electrode 210. The second common electrode 210 and the first common electrode 110 have an equal potential.

Specifically, the display panel includes a plurality of pixel units. There is a plurality of sub-pixels in each pixel unit, for example, a red sub-pixel R, a green sub-pixel G, and a blue sub-pixel B. The color film substrate 200 may have a color resist layer, and the color resistance layer may include different color resistances. The color of each sub-pixel can be achieved by color resistance of different colors.

Each of the pixel electrodes 120 is disposed opposite to a portion of the second common electrode 210. Each sub-pixel corresponds to one pixel electrode 120. A plurality of sub-pixels may share one second common electrode 210. The sub-pixel may include a pixel electrode 120, a second common electrode 210 opposite to the pixel electrode 120, and liquid crystal molecules 300 therebetween. The liquid crystal molecules 300 in each of the sub-pixels may be deflected in a case where a voltage difference is formed between the pixel electrode 120 and the second common electrode 210, thereby making each sub-pixel to be displayed transparently.

A thin film transistor may also be included in the array substrate 100. The pixel electrode 120 is electrically connected to the drain electrode of the thin film transistor, so as to charge the sub-pixel. The second common electrode 210 is electrically connected to the first common electrode 110 with an equal potential, so that the second common electrode 210 can be powered by the first common electrode 110.

Figure 2:
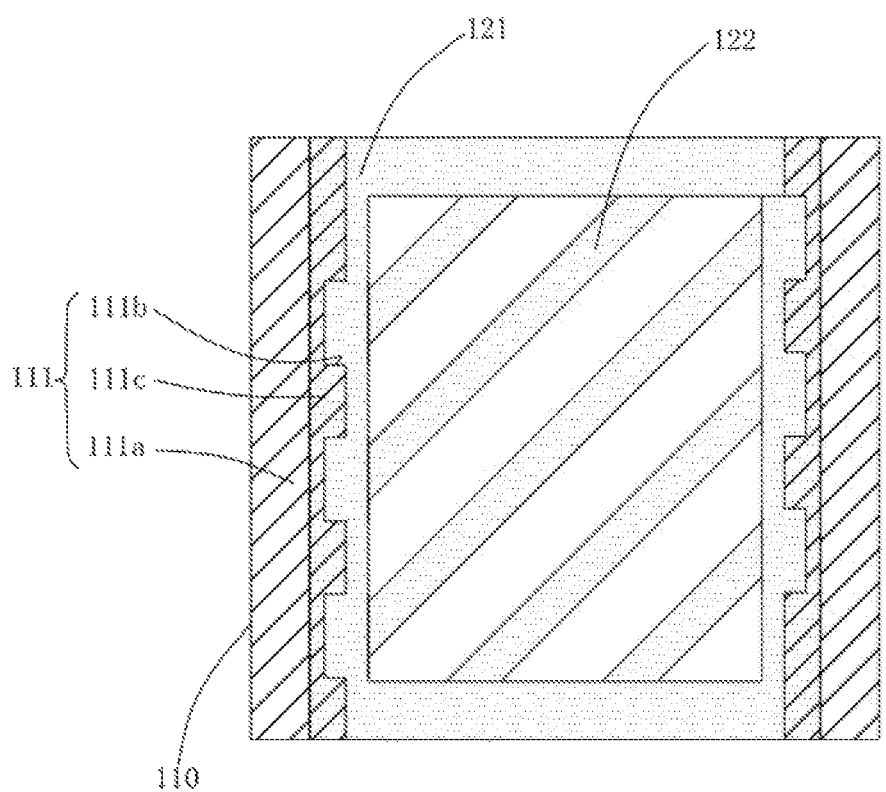
FIG. 2 is a schematic view of an array substrate in one embodiment.

Referring to FIG. 2, the pixel electrode 120 includes a frame 121 and a branch 122. The frame 12 surrounds the circumference of the branch 122. The branch 122 and the frame 121 are connected.

The first common electrode 110 includes a side plate 111 disposed opposite to the frame 121. The side plate 111 includes a shielding electrode plate 111a. The shielding electrode plate 111a surrounds the orthographic projection of the frame 121. In the embodiment of the present application, the side plate 111 may be disposed opposite to a portion of the frame 121 (refer to FIG. 2 and FIG. 3), or may be disposed opposite to the whole frame 121 (not shown), and is not limited in this application.

The shielding electrode plate 111a is located between each sub-pixel and is opposite to the second common electrode 210 between the sub-pixels. The first common electrode 110 and the second common electrode 210 have an equal potential, and the shielding electrode plate 111a is a part of the first common electrode 110. Therefore, the shielding electrode plate 111a and the second common electrode 210 between each of the sub-pixels have an equal potential, that is, there is no voltage difference between the shielding electrode plate 111a and the second common electrode 210. The liquid crystal molecules 300 between the shielding electrode plate 111a and the second common electrode 210 between each of the sub-pixels stand along the equipotential lines, thereby obscuring the light source. In this way, the sub-pixels are displayed in a dark state. However, due to the interaction between the electric fields, the electric field on the shielding electrode plate 111a also affects the electric field on the pixel electrode 120 in the vicinity thereof.

When the display panel is displaying normally, the electric field generated by the voltage on the branch 122 guides the liquid crystal molecules 300 between the branch 122 and its surrounding region and the second common electrode 210 to be deflected and transmit light. The field strength between the branch 122 and the second common electrode 210 is $E_1$, and the field strength between the surrounding region of the branch 122 and the second common electrode 210 is $E_2$. Since there is no voltage in the surrounding region, $E_2$ is weaker than $E_1$. Therefore, when the electric field generated by the voltage of the branch 122 near the shielding electrode plate 111a is weakened by the electric field generated by the voltage on the shielding electrode plate 111a, the field strength $E_2$ between the surrounding region around here and the second common electrode 210 becomes weaker. As a result, the corresponding liquid crystal molecules 300 are easily deflected out of order, and the light cannot be normally transmitted, so that dark lines are likely to be formed as the edge of the sub-pixel, which affects the transmittance of the panel.

In the embodiment of the present application, the side plate 111 of the first common electrode 110 is disposed opposite to the frame 121 of the pixel electrode 120. The frame 121 of the pixel electrode 120 surrounds the branch 122. A groove 111b is provided on a side of the side plate 111 facing the branch 122. The distance between the shielding electrode plate 111 corresponding to the groove 111b and an inner side of the frame 121 (a side connected to the branches 122) is pulled away. Therefore, the influence on to the electric field on the branch 122 through which the liquid crystal molecules transmit light due to the electric field on the shielding electrode plate 111 is weaken, thereby improving on the dark line phenomenon at the edge of the sub-pixel.

Figure 3:
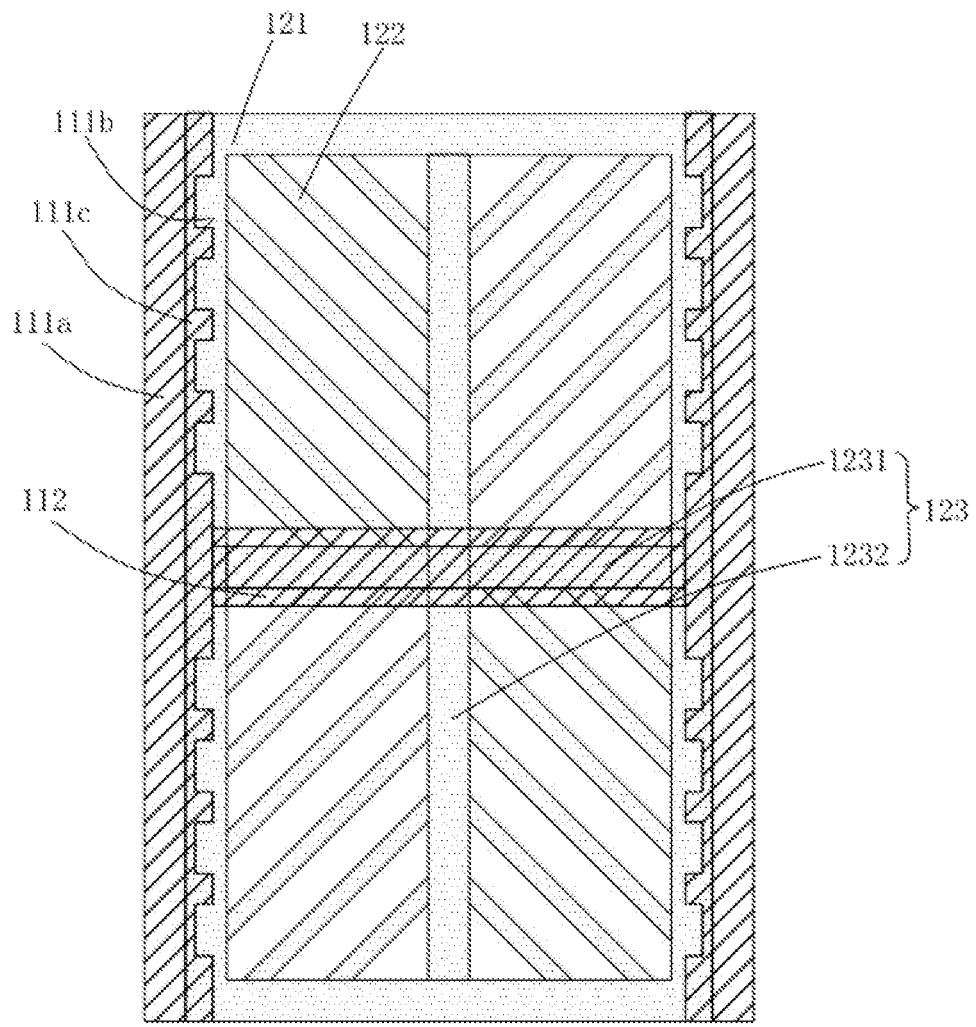
FIG. 3 is a schematic view of an array substrate in another embodiment.

Referring to FIG. 2 and FIG. 3, in one embodiment, the groove 111b on the first common electrode 110 is opposite to the orthographic projection of the branch 122 on the pixel electrode. Specifically, one groove 111b may be opposite to one orthographic projection of the branch 122, or one groove 111b may be opposite to a plurality of orthographic projections of the branches 122, or a plurality of grooves 111b may be opposite to one orthographic projection of the branch 122.

The dark line phenomenon at the edge of the sub-pixel is mainly due to the electric field on the branch 122 being affected by the electric field on the shielding electrode plate 111a. Therefore, by arranging the groove 111b opposite to the orthographic projection of the branch 122, the distance between the branch 122 and the shielding electrode plate 111a can be directly pulled away. In this way, it may be better to resist the influence on the electric field on the shielding electrode plate 111a, and the dark lines can be more effectively suppressed.

Of course, in the embodiment of the present application, the groove 111b may not be disposed opposite to the orthographic projection of the branch 122 or may be disposed opposite to a part of the orthographic projection of the branches 122, which is not limited in this application.

In one embodiment, the side plate 111 further includes a capacitor electrode plate 111c. The capacitor electrode plate 111c and the shielding electrode plate 111a are connected to each other. In addition, the capacitor electrode plate 111c forms a storage capacitor with the frame 121. The storage capacitor can keep the voltage on the pixel electrode 120 continuous during the process of displaying. In this way, there is a continuous voltage supply on the pixel electrode 120, so as to effectively avoid display abnormality.

In one embodiment, the groove 111b is formed on the capacitor electrode plate 111c. That is, the groove is provided on the capacitor electrode plate 111c, and the whole groove 111b is surrounded by the capacitor electrode plate 111c, thereby ensuring that the capacity on the storage capacitor is sufficiently large so as to keep the voltage on the pixel electrode 120 continuous.

In the embodiment of the present application, the groove 111b may be disposed through the capacitor electrode plate 111c and the shielding electrode plate 111a, etc., and the groove 111b is not limited to being formed only on the capacitor electrode plate 111c.

In one embodiment, while the groove 111b is formed on the capacitor electrode plate 111c, one groove 111b is disposed opposite to one orthographic projection of the branch 122. Further, under the premise that the influence on the electric field on the branch 122 due to the shielding electrode plate 111a is effectively reduced, the portion between the grooves 111b may also be used to form a storage capacitor, thereby increasing the capacity of the capacitor.

In one embodiment, on the basis of the above embodiment, an area of a notch of the groove 112b is set to be larger than an area of a surface of the branch facing a side of the groove 111b. In this way, the groove 111b protects the branch 122 sufficiently from the influence from the electric field on the shielding electrode plate 111a.

In one embodiment, a cross-sectional shape of a cross section of the groove 111b in a direction perpendicular to a thickness of the side plate 111 is a quadrilateral, so as to facilitate the patterning process of the groove 111b. Specifically, the quadrilateral may be a rectangle, a square, a parallelogram, a diamond, a trapezoid, or the like. Of course, in the embodiment of the present application, the above quadrilateral may also be replaced by any other polygons, such as a triangle, a pentagon, a hexagon, or the like. Alternatively, the above quadrilateral may be replaced by a non-polygon (such as a circular arc).

Referring to FIG. 3, in one embodiment, the pixel electrode 120 further includes a trunk 123. The trunk 123 is connected to the branch 122 at both sides. The trunk 123 divides the pixel electrode 120 into a plurality of domains such that there is a plurality of domains within one sub-pixel. The length directions of the branches 122 in adjacent domains are different. Therefore, when a voltage is applied, the tilt directions of the liquid crystal molecules 300 in various domains are different. Therefore, the liquid crystal molecules 300 in one sub-pixel have various tilt directions. In this way, it is more advantageous to display a wide viewing angle of the display panel.

The groove 111b is provided on the side plate 111 corresponding to the domain. In this way, the distance between the inner side of the frame 121 corresponding to the domain and the shielding electrode plate 111a may be pulled away, thereby effectively improving on the dark line phenomenon in the domain of the sub-pixel. When the groove is provided in the side plate 111 corresponding to each domain, the dark line phenomenon can be effectively improved in each domain, thereby further suppressing the edge dark lines effectively in the whole sub-pixel.

In one embodiment, as shown in FIG. 1 and FIG. 3, the array substrate 100 includes the first common electrode 110 and the pixel electrode 120.

The pixel electrode 120 includes a frame 121, a trunk 123, and a branch 122. The frame 121 connected and surrounds the trunk 123 and the branch 122. The trunk 123 includes a first trunk 1231 and a second trunk 1232. The first trunk 1231 intersects the second trunk 1232 and divides the inner region of the pixel electrode 120 into four domains in equal sizes. The branches 122 are distributed in each of the domains and connect the trunk 123 and the frame 121. The length directions of the branches 122 in adjacent domains are different. The angle between the extending direction of the branches 122 of the four domains and a trunk 123 (for example, the first trunk 1231) may be ±45° and ±135°, respectively. At this time, when a voltage is applied, the tilt directions of the liquid crystal molecules 300 in the four domains are different. There are four tilt directions of the liquid crystal molecules 300 in one sub-pixel. There may be a plurality of branches 122 in each of the domains, and the plurality of branches 122 in one domain may have a fixed interval therebetween.

The first common electrode 110 includes a side plate 111 disposed opposite to the frame 121. The side plate 111 includes a shielding electrode plate 111 and a capacitor electrode plate 112 that are connected to each other. The shielding electrode plate 111 surrounds the orthographic projection of the frame 121. In addition, the shielding electrode plate 111 is opposite to the second common electrode 210 between each of the sub-pixels, so that the liquid crystal molecules 300 between the shielding electrode plate 111 and the second common electrode 210 are shielded from light to display a dark state. The capacitor electrode plate 112 and the frame 121 form a storage capacitor. The storage capacitor keeps the voltage on the pixel electrode 120 continuous during the process of displaying. In order to increase the capacity of the storage capacitor, the first common electrode 110 may further be provided with a central plate 112, and the central plate 112 may be connected to opposite sides of the side plate 111, thereby facilitating connecting with the side plate 111 in an equal potential. The central board 112 can be disposed opposite to a trunk 123 (e.g., the first trunk 1231) to form a storage capacitor.

The groove 111*b* opposite to orthographic projection of the branch 122 is provided on a side of the side plate 111 facing the branch 122. The distance between the branch 122 and the shielding electrode plate 111*a* is pulled away by the groove 111*b*, thereby effectively reducing the influence on the electric field on the branch 122 due to the electric field on the shielding electrode plate 111*a*. Therefore, the dark lines at the edge of the sub-pixel are effectively suppressed.

In summary, according to the array substrate provided in the present application, the side plate of the first common electrode includes a shielding electrode plate, and a groove is provided on a side of the side plate facing the branch. The distance between the shielding electrode plate corresponding to the groove and a side of the frame connected the branch is increased. Therefore, the influence on the electric field on the branch through which the liquid crystal molecules transmit light due to the electric field on the shielding electrode plate is weaken, thereby improving the dark line phenomenon at the edge of the sub-pixel.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the disclosed subject matter is illustrated and described herein with reference to specific embodiments, the disclosure is not intended to be limited to the details shown. Rather, various modifications may be made in the details within the scope and range of equivalents of the claims and without departing from the present disclosure.

What is claimed is:

1. An array substrate, comprising:
   a pixel electrode, including a frame connected to and surrounding a branch; and
   a first common electrode insulated from the pixel electrode, including a side plate disposed opposite to the frame, the side plate including a shielding electrode plate, wherein the shielding electrode plate surrounds an orthographic projection of the frame, and a groove is provided on a side of the side plate facing the branch, and wherein the groove is recessed from a portion of a side of the side plate facing the branch toward the shielding electrode plate in a plane of the side plate to divide a side surface of the side plate facing the branch into at least one recessed portion and at least one unrecessed portion;
   wherein the frame has an inner side, a portion of the inner side is directly connected to and contacts the branch, a distance between the recessed portion of the side plate corresponding to the groove and the inner side of the frame corresponding to the groove, is greater than a distance between the unrecessed portion of the side plate and the inner side of the frame corresponding to the unrecessed portion.

2. The array substrate of claim 1, wherein the groove is opposite to an orthographic projection of the branch.

3. The array substrate of claim 2, wherein one groove is opposite to the orthographic projection of one branch.

4. The array substrate of claim 2, wherein one groove is opposite to orthographic projections of a plurality of branches.

5. The array substrate of claim 2, wherein a plurality of the grooves is opposite to the orthographic projection of one branch.

6. The array substrate of claim 1, wherein the side plate further includes a capacitor electrode plate, the capacitor electrode plate and the shielding electrode plate being connected to each other, the capacitor electrode plate being located at the side of the side plate facing the branch, and the shielding electrode plate being located at a side of the side plate away from the branch and the capacitor electrode plate forming a storage capacitor with the frame.

7. The array substrate of claim 6, wherein the groove is formed on the capacitor electrode plate.

8. The array substrate of claim 7, wherein one groove is disposed opposite to an orthographic projection of one branch.

9. The array substrate of claim 8, wherein an area of a notch of the groove is larger than an area of a surface of the branch facing a side of the groove.

10. The array substrate of claim 1, wherein a cross-sectional shape of a cross section of the groove in a direction perpendicular to a thickness of the side plate is a polygon.

11. The array substrate of claim 10, wherein the polygon is a quadrangle.

12. The array substrate of claim 11, wherein the quadrangle is one of a rectangle, a square, a parallelogram, a diamond, and a trapezoid.

13. The array substrate of claim 10, wherein the polygon is one of a triangle, a pentagon, and a hexagon.

14. The array substrate of claim 1, wherein the pixel electrode further includes a trunk connected at both sides to the branch, the trunk dividing an internal region of the pixel electrode into a plurality of domains, the length directions of the branches in adjacent domains being different, and the grooves being disposed on the side plates corresponding to the domains.

15. The array substrate of claim 14, wherein the trunk includes a first trunk and a second trunk, the first trunk intersecting the second trunk and dividing the inner region of the pixel electrode into four domains of equal size.

16. The array substrate of claim 15, wherein the array substrate further comprises a central plate, the first trunk forming a storage capacitor with the central plate.

17. The array substrate of claim 16, wherein the central plate connects opposite sides of the side plate.

18. An array substrate, comprising:
    a pixel electrode, comprising a frame, a trunk, and a branch; wherein the frame connects and surrounds the trunk and the branch; the trunk includes a first trunk and a second trunk, the first trunk intersecting the second trunk and dividing the inner region of the pixel electrode into four domains of equal size; the branch is distributed in each of the domains and connects the trunk and the frame; and the length directions of the branches in adjacent domains are different; and a first common electrode insulated from the pixel electrode, comprising a side plate disposed opposite to the frame, the side plate including a shielding electrode plate and a capacitor electrode plate; wherein the shielding electrode plate surrounds an orthographic projection of the frame, the capacitor electrode plate forms a storage capacitor with the frame, and a groove opposite to orthographic projection of the branch is provided on a side of the side plate facing the branch, and wherein the groove is recessed from a portion of a side of the side plate facing the branch toward the shielding electrode plate in a plane of the side plate to divide a side surface of the side plate facing the branch into at least one recessed portion and at least one unrecessed portion;

wherein the frame has an inner side, a portion of the inner side is directly connected to and contacts the branch, a distance between the recessed portion of the side plate corresponding to the groove and the inner side of the frame corresponding to the groove, is greater than a distance between the unrecessed portion of the side plate and the inner side of the frame corresponding to the unrecessed portion.

19. A display panel, comprising liquid crystal molecules, a color film substrate, and an array substrate, wherein the array substrate is disposed opposite to the color film substrate, and the liquid crystal molecules are located between the color film substrate and the array substrate, the array substrate comprising:

a pixel electrode, including a frame and a branch connected to the frame, the frame surrounding the branch; and a first common electrode insulated from the pixel electrode, the first common electrode including a side plate disposed opposite to the frame, the side plate including a shielding electrode plate, wherein the shielding electrode plate surrounds an orthographic projection of the frame, and a groove is provided on a side of the side plate facing the branch, and wherein the groove is recessed from a portion of a side of the side plate facing the branch toward the shielding electrode plate in a plane of the side plate to divide a side surface of the side plate facing the branch into at least one recessed portion and at least one unrecessed portion;

wherein the frame has an inner side, a portion of the inner side is directly connected to and contacts the branch, a distance between the recessed portion of the side plate corresponding to the groove and the inner side of the frame corresponding to the groove, is greater than a distance between the unrecessed portion of the side plate and the inner side of the frame corresponding to the unrecessed portion;

the color film substrate includes a second common electrode, and the second common electrode and the first common electrode have an equal potential.

\* \* \* \* \*